(12) United States Patent
Kaempf et al.

(10) Patent No.: US 7,445,119 B2
(45) Date of Patent: Nov. 4, 2008

(54) CHIP RECEPTACLE, METHOD FOR FABRICATING A CHIP RECEPTACLE AND CHIP TRANSPORT CONTAINER

(75) Inventors: Mathias Kaempf, Burglengenfeld (DE); Frank Singer, Regenstauf (DE); Jurgen Dachs, Reichertshofen (DE); Alfred Bachler, Zeitlarn (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 956 days.

(21) Appl. No.: 10/834,754

(22) Filed: Apr. 29, 2004

(65) Prior Publication Data
US 2005/0002763 A1   Jan. 6, 2005

(30) Foreign Application Priority Data
Apr. 30, 2003 (DE) ................. 103 19 576

(51) Int. Cl.
*B65D 85/90* (2006.01)
*C23F 1/00* (2006.01)
*B65G 49/05* (2006.01)

(52) U.S. Cl. ............... 206/701; 206/714; 206/723; 216/2; 414/758; 414/935

(58) Field of Classification Search ............ 216/2; 414/758, 935; 206/701–728
See application file for complete search history.

(56) References Cited

U.S. PATENT DOCUMENTS

| | | | |
|---|---|---|---|
| 3,465,874 A * | 9/1969 | Hugle et al. | 206/714 |
| 5,252,294 A * | 10/1993 | Kroy et al. | 422/102 |
| 5,707,537 A | 1/1998 | Bartha et al. | |
| 6,366,468 B1 | 4/2002 | Pan | |
| 2005/0194668 A1* | 9/2005 | Enquist et al. | 257/678 |

* cited by examiner

*Primary Examiner*—Evan Pert
(74) *Attorney, Agent, or Firm*—Cohen Pontani Lieberman & Pavane

(57) ABSTRACT

Cavities for holding semiconductor chips are etched anisotropically into a semiconductor wafer. An orientation of the wafer in the (100) pulling direction results in geometrically exactly etched sidewalls of the cavities with an angle of 125.3°. What is thereby achieved is that chips can slip into the cavity with a low risk of damage. A transparent cover plate is situated on the cavity plate.

49 Claims, 3 Drawing Sheets

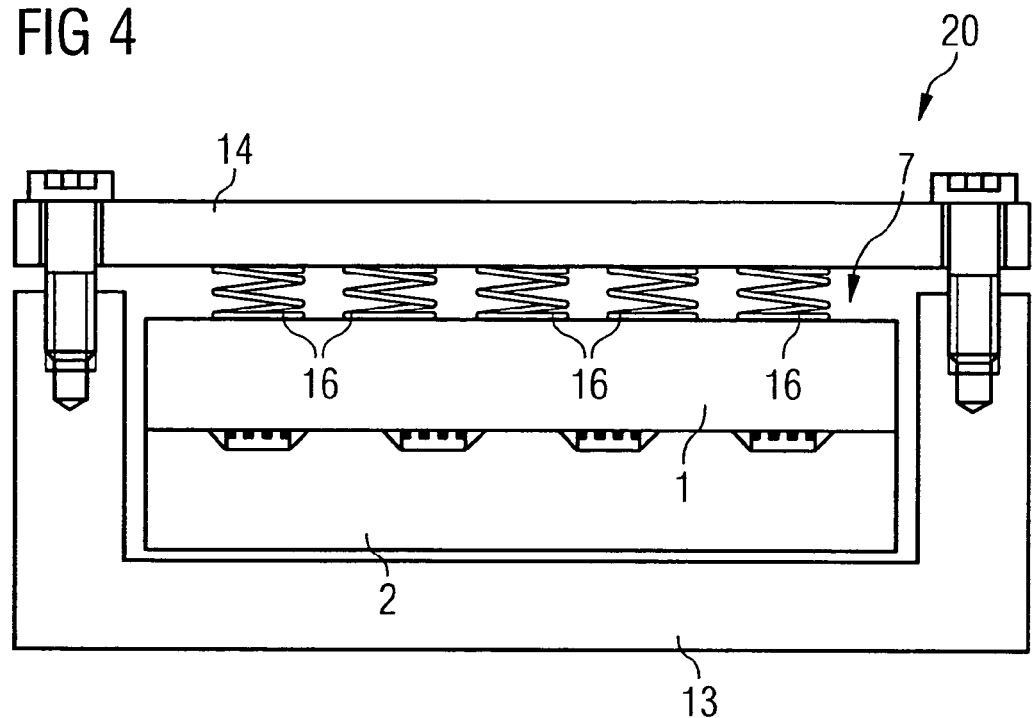
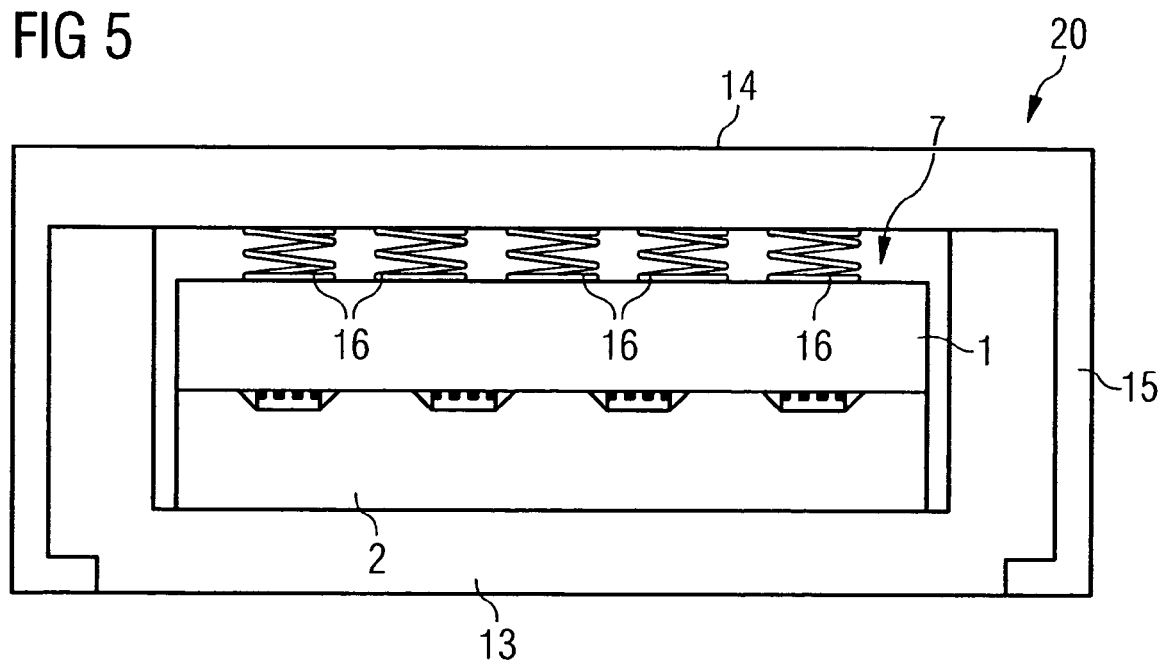

CHIP RECEPTACLE, METHOD FOR FABRICATING A CHIP RECEPTACLE AND CHIP TRANSPORT CONTAINER

RELATED APPLICATIONS

This patent application claims the priority of German Patent Application 103 19 576.9, the disclosure content of which is hereby incorporated by reference.

FIELD OF THE INVENTION

The invention relates to a chip receptacle having a plurality of cavities for respectively receiving a semiconductor chip, to a method for fabricating such a chip receptacle, and to a container for transporting such a chip.

BACKGROUND OF THE INVENTION

In the process for fabricating electronic, in particular optoelectronic, components, there is a need to store, to handle and to transport individual chips. Transport steps may be effected both in the course of production and quality control and on route to the customer. Depending on their design, chips have parts and surfaces of different sensitivity and can thus be damaged in different ways during these individual process steps. By way of example, high-power laser diodes have sensitive mirror facets which must not be damaged nor contaminated in the course of transport during the final inspection steps after singulation or during transport to the customer. Neither cleaning nor photolithographic or mechanical rework can be effected in the singulated state.

Chips are conventionally held or transported for example in so-called gel packs. In this case, a special plastic functions as an adhesion medium. Individual chips are deposited on said adhesion medium, to which they adhere even in the event of strong vibrations. They do not fall out of the receptacle and scarcely change their position. The adhesion film is situated on the underside of the bottom of a plastic box. The chips are removed on a vacuum station. Here, parts of the adhering film are sucked into the cavities of the grid structure situated underneath, thereby reducing the effective adhesion area. Consequently, such vacuum stations have to be present wherever chips are intended to be removed from the receptacle, that is to say also on the customer's premises. Reuse of the gel packs is critical since the residues and contaminations of the plastic can reduce the long-term stability of chips stored in such receptacles.

A further possibility for chip storage and chip transport consists in so-called waffle packs, which dispense with an adhering gel layer. In this case, cavities are present in a plastic box, into which the individual chips can be placed.

When using plastic-containing holding receptacles for chips, there is the problem that individual constituents of the plastics can outgas, which may result in contamination of individual parts of the chips. Thus, the mirror property of a dielectric mirror which functions according to the principle of light refraction at layers having different refractive indexes and thus relies on high material purity may be altered and the output power of a component may thus be reduced.

Furthermore, there is the problem that the chips have a relatively large freedom of movement within the cavities, so that, during transport, there is the risk of chips standing up, tilting or striking the cover of the receptacle with their top side, as a result of which damage may arise.

SUMMARY OF THE INVENTION

One object of the invention is to provide a chip receptacle and a chip transport container which allow electronic components, in particular optoelectronic components, to be held and transported.

A particular object is to provide a chip receptacle which enables individual chips to be held or transported substantially without damage or contamination.

These and other objects are obtained in accordance with one aspect of the present invention directed to a chip receptacle having a plurality of cavities for respectively receiving a semiconductor chip. The chip receptacle includes a cavity plate, and the plurality of cavities are etched in said cavity plate.

Another aspect of the present invention is directed to a method for fabricating a chip receptacle having a plurality of cavities for a respective semiconductor chip, by providing a cavity plate, and etching cavities in the cavity plate.

Yet another aspect of the present invention is directed to a chip transport container for receiving a chip receptacle as described just above, wherein provision is made of a bottom part with a recess for the chip receptacle and a cover part with spring elements, which press the cover plate of the chip receptacle onto the cavity plate when the chip transport container is closed. Releasable connecting means are provided for connecting the cover part and the bottom part.

A chip receptacle according to the invention contains a plurality of cavities for a respective semiconductor chip. It has a cavity plate, in which the cavities are fabricated by means of etching. This makes it possible to fabricate cavities with dimensions that can be set very precisely.

In a preferred embodiment, the etching of the cavities comprises an anisotropic etching step. This advantageously facilitates a setting of special geometries of the cavities, for example special sidewall geometries.

In a particularly preferred embodiment of the chip receptacle, the cavities taper with increasing depth. Such cavities have the advantage that chips deposited in the cavities can slide along the oblique side areas thereof toward the bottom of the cavities.

Particular preference is attached to cavities which have a trapezoidal cross section perpendicular to the main direction of extent of the cavity plate, which taper with increasing cavity depth. In the case of such a geometry of the cavities, it is particularly simple to deposit chips into the cavities without damaging the sides and the surface. Principally the edge between chip underside and chip sidewalls is in contact with the side areas of the cavities while the chips are being placed into the cavities. By contrast, the sidewalls and the top side of the chips are advantageously protected to the greatest possible extent.

In a preferred embodiment, the cavity plate has crystalline material. The use of crystalline material for the cavity plate makes it easier to carry out an anisotropic etching step.

In a particularly preferred embodiment, boundary areas of the cavities lie in crystal planes of the cavity plate. The desired boundary areas of the cavities are uncovered during etching by means of a suitable etching mask which defines the openings of the cavities. The bottom and side areas of the cavities lie in lattice planes of the crystal structure of the material of the cavity plate.

The cavity plate particularly preferably comprises a semiconductor wafer. Semiconductor wafers are available as standard in semiconductor technology, so that, aside from the etching of the cavities, a large additional production effort is not necessary for the fabrication of the chip receptacles according to the invention.

In a preferred embodiment, the semiconductor wafer contains silicon and/or gallium arsenide. These two materials are in widespread usage in semiconductor technology and, furthermore, have the advantage that they can be etched anisotropically.

Particular preference is attached to a semiconductor wafer fabricated from an Si crystal pulled in the (100) direction, sidewalls of the cavities in such a chip receptacle lying in the (111) plane. The use of a semiconductor wafer fabricated from an Si crystal pulled in the (100) direction thus makes it possible, owing to the constant angular ratios between the (100) plane and the (111) plane, for an angle of 125.3° to be present between the bottom of the cavities and the sidewalls of the cavities as seen from the interior of the cavity. Such an angle enables chips to slip into the cavities without the sidewalls of the chips coming into contact areally with the sidewalls of the cavities, but rather only primarily at the edge between underside and sidewalls of the chips. The top side of the chips, which is often very sensitive, does not come into contact with the cavity plate. An excessively steep angle of the sidewalls would result in the disadvantage of the sidewalls of the chips coming into contact too much with the sidewalls of the cavities; shallow angles of the sidewalls, by contrast, would have the disadvantage that the chips would not slip onto the bottom of the cavities by virtue of their intrinsic weight.

Potassium hydroxide solution (KOH) is particularly preferably used as the etching medium. This etching medium is suitable for anisotropically etching silicon, in particular. Further etching media can also be used for silicon; dry etching methods are also possible in addition to wet etching methods. Other semiconductor materials, vitreous or ceramic materials can be etched anisotropically by means of respectively specific etching media. GaAs-based materials, which are likewise preferably suitable for the cavity plate, can be etched anisotropically by means of chlorine-based dry etching media.

The chip receptacle particularly preferably has a cover plate. Such a cover plate makes it possible to protect chips in the chip receptacle from ambient influences and mechanical damage, reduces the freedom of movement of the chips in the cavity plate and can be utilized for hermetically sealing the chip receptacle.

In a preferred embodiment, the cover plate is transparent. This enables an optical inspection of the chips in the chip receptacle without having to remove the cover. This substantially prevents contamination of the chips during a checking step.

Particular preference is attached to a cover plate comprising at least one material from the group consisting of silicon, quartz and glass. These materials for the cover plate contain chemical elements which for the most part are present in the semiconductor materials of the chips or which do not harm the semiconductor chips to the greatest possible extent.

In a preferred embodiment of the chip receptacle, the cavity plate and the cover plate have such planar contact areas that the cover plate can seal substantially tightly with the cavity plate. This greatly reduces ambient influences on the chips in the chip receptacles. The cover plate advantageously has cavities which are in each case assigned to a cavity of the cavity plate.

In an advantageous embodiment, each cavity of the cover plate is in each case assigned to a cavity of the cavity plate, in such a way that, when the chip receptacle is turned, each chip from the cavity of the cavity plate can pass into the assigned cavity of the cover plate. After the cavity plate has been lifted off from the cover plate, the chips turned through 180° can then be removed from the cavities of the cover plate. In the course of turning the chips, the latter are advantageously exposed to only comparatively small mechanical influences in comparison with the conventional methods, so that the risk of damage to the chips in the course of turning can be significantly reduced.

In an advantageous embodiment of the cavity plate, the cavities are deeper than the height of the chips that are to be stored therein. In the case of using a cover plate without cavities, the cover plate consequently does not press directly onto chips stored in the cavity plate, rather it only bears on the cavity plate. The chips then have a slight degree of play in the cavities with the cover plate having been emplaced. The cavities of the cavity plate are preferably approximately 10 μm deeper than the height of the chips. This cavity depth reduces the risk of the chips being damaged during transport of the chips as a result of the chips tilting or standing up in the cavities of the chip receptacle. The small distance of 10 μm between chip surface and cover plate in the chip receptacle has the effect that, in the event of the chips tilting in the cavities, the surface of the chips come into contact with the cover plate at a very shallow angle. Thus, rather than a punctiform or linear loading of the chip surface, a virtually areal loading of the chip surface occurs. This substantially prevents damage to the chip surface.

In a preferred embodiment of the chip receptacle, the dimensions of the bottom area of the cavities correspond as precisely as possible to the dimensions of the bottom area of the chips. This measure furthermore reduces the freedom of movement of the chips within the cavities, thereby further reducing the risk of damage to the chips.

In a further advantageous embodiment of the chip receptacle, the cavity plate and/or the cover plate has an electrically conductive surface layer. Such a layer counteracts an electrostatic charging of the chip receptacle and of the chips and associated damage to the chips.

The electrically conductive surface layer advantageously has a metal which is identical to a metal in the contact layer of the semiconductor chips. The use of such a metal reduces the risk of undesirable contamination of parts of the chips with substances which might adversely alter the properties of the chips.

In a preferred embodiment, the cavity plate has a surface layer made of dielectric material. It is also possible to combine different layers made of dielectric material and electrically conductive material such as metal.

In an advantageous chip transport container, the cavity plate is inserted into a bottom part of said chip transport container, the cover plate is placed onto the cavity plate, and the cover plate is pressed onto the cavity plate by means of fixing to the baseplate. Containers with cover brackets are advantageously used for this purpose, which preferably press onto the cover plate, on the one hand, and are connected to the bottom part, on the other hand.

BRIEF DESCRIPTION OF THE INVENTION

FIG. 4 shows a diagrammatic illustration of a section through a chip transport container in accordance with one exemplary embodiment.

FIG. 5 shows a diagrammatic illustration of a section through a chip transport container in accordance with a further exemplary embodiment.

DETAILED DESCRIPTION OF THE DRAWINGS

In the various exemplary embodiments, identical or identically acting component parts are in each case designated identically and provided with the same reference symbols. The layer thicknesses illustrated are not to be regarded as true to scale. Rather, for the sake of better understanding, the illustration shows them with an exaggerated thickness and not with the actual thickness ratios with respect to one another.

Figure 1:
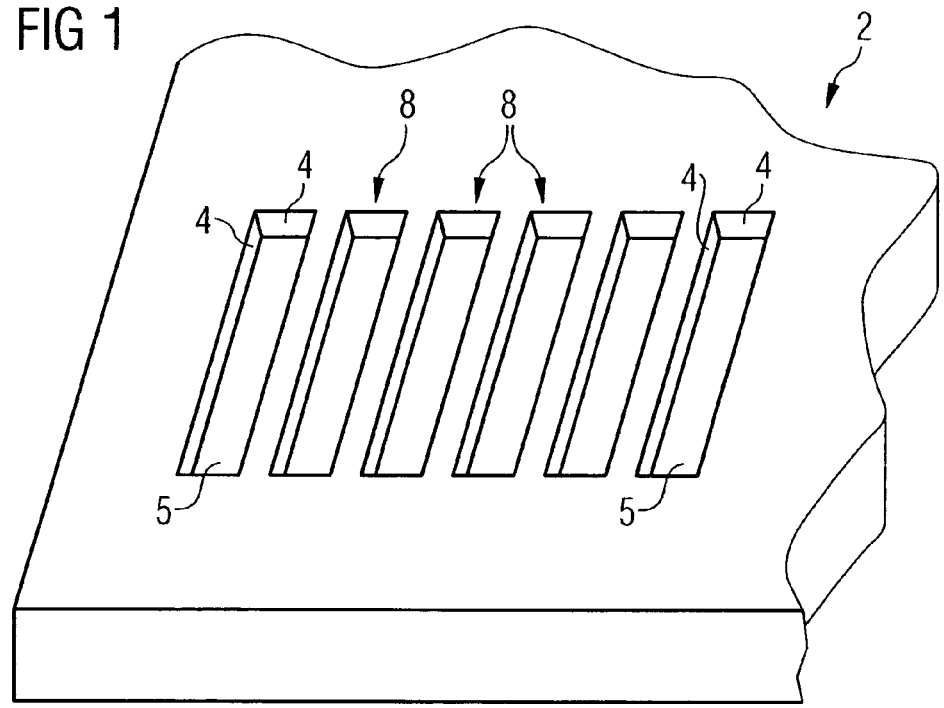
FIG. 1 shows a diagrammatic perspective illustration of a detail from a cavity plate in accordance with a first exemplary embodiment.

The first exemplary embodiment, as is illustrated in FIG. 1, concerns a cavity plate 2 fabricated from an Si wafer, with a respective cavity 8 for a respective semiconductor chip, for example for laser diode bars. The top side of the cavity plate lies in a plane perpendicular to the (100) pulling direction of the crystal from which the semiconductor wafer is fabricated. The wafer is for example an Si wafer or an Si based wafer. The cavities are fabricated for example using KOH by means of anisotropic etching advantageously with the aid of customary mask techniques. The resulting side areas 4 of the cavities lie in (111) planes of the wafer and thus form an angle of 125.3° with the bottom area of the cavity 5 in the case of an Si wafer. The pyramidal tapering of the cavities 8 toward the interior of the cavity plate 2 has the advantage that chips which are intended to be placed into the cavities 8 can slip along the oblique side areas 4 of the cavities 8 onto the bottom area 5. This is highly protective for the chips.

By using a different crystal orientation, other wafer materials and/or other etching media and/or methods, cavities with other geometries can be produced in adaptation to other chip geometries.

Potassium hydroxide solution (KOH) is suitable for anisotropic etching particularly in the case of silicon, since etching areas arise along lattice planes in the crystal silicon during etching. Other known etching media can also be used for silicon; suitable cavities can also be produced by means of known dry etching methods.

As an alternative, e.g. a mixture of HF and $HNO_3$, ethylenediamine pyrocatechol (EDP), NaOH, LiOH or $NH_4OH$ may also be used for etching the wafer. Furthermore, etching gases such as e.g. fluorine gases (e.g. $CF_4$, $NF_3$, $SF_6$, $CHF_3$, $C2F_8$, $XeF_2$ or mixtures of these gases) or chlorine gases (e.g. $SiCl_4$, $BCl_3$, $Cl_2$, $CCl_4$, $CF_3Cl$, $CCl_2F_2$) are also suitable, which may e.g. also be mixed with further gases such as e.g. noble gases. Aside from KOH, EDP is particularly preferred as an etchant, in particular for Si.

Instead of an Si or Si-based wafer, it is also possible to use e.g. a GaAs or GaAs-based wafer. The latter can be etched for example wet-chemically in particular using a mixture of $H_2SO_4$, $H_2O_2$ and $H_2O$ or a mixture of $NH_3$, $H_2O_2$ and $H_2O$. The use of an etching gas for dry etching, such as e.g. a chlorine gas which may be mixed e.g. with further gases such as noble gases, for example, is likewise advantageously possible.

If the cavity plate is fabricated from an Si wafer pulled in a direction other than the (100) direction, other angles of the side areas can be established.

For clear arrangement, the individual cavities can be subdivided into groups and numbered. Numbering can likewise be carried out by etching. The dimensions of the bottom area 5 of the cavities 8 correspond to those of the bottom of the chips to be stored, thereby greatly restricting the slipping of the chips within the cavities along the bottom areas.

Figure 2:
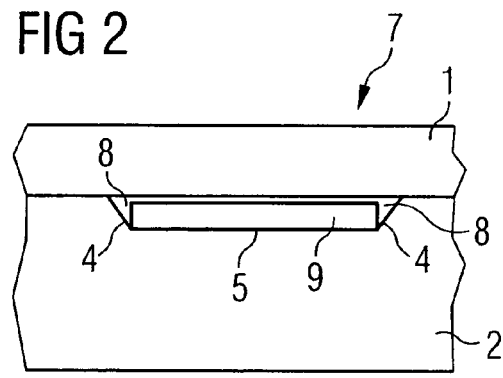
FIG. 2 shows a diagrammatic illustration of a section through a detail from a cavity plate with a cover plate in accordance with a second exemplary embodiment.

The exemplary embodiment in accordance with FIG. 2 concerns a chip receptacle 7 with a cavity plate 2 in accordance with FIG. 1 and a cover plate 1, the cover plate 1 bearing in planar fashion on the cavity plate 2. Consequently, the cavities 8 are substantially sealed tightly against ambient influences.

A chip 9 situated in a cavity 8 of the chip receptacle 7 bears to the greatest possible extent exactly with its underside on the bottom area 5 of the cavity 8. The small degree of play between the chip 9 and the edges between bottom 5 and the side areas 4 of the cavity 8 enables a high degree of fixing of the chip 9 in the cavity 8.

The distance between the top side of the chip and the cover plate 1 is 10 µm, which can be set exactly by means of the anisotropic etching method. This or a similarly small distance between the chip 9 and the cover plate 1 reduces possible damage which the top side of the chip may experience if the chip 9 strikes the cover plate 1 with its top side during transport. The small distance between the chip 9 and the cover plate 1 has the effect that in the event of tilting of the chip 9, there is a very small angle between the top side of the chip and the cover plate 1, with the result that small forces are exerted on the top side of the chip, which is often very sensitive. In the event of unforeseen tilting or turning—provided in the method—of the entire chip receptacle, for example during transport or prior to further processing of the chips, the chip only has to withstand very small drops to be undamaged to the greatest possible extent.

In this exemplary embodiment, the cover plate 1 of the chip receptacle 7 is fabricated from quartz glass and is thus transparent. This opens up the possibility of being able to carry out an optical inspection of the chips through the cover plate without having to remove the cover plate. Si and glass, by way of example, are appropriate as further materials for the cover plate, Si being particularly preferred. The materials mentioned are furthermore advantageous because the chemical elements which they contain are usually contained in customary semiconductor chips anyway and are thus relatively uncritical with regard to contamination.

By way of example, if avoiding contamination is of primary importance and a suitable transparent material is not available, or if a transparent cover plate is not required, it is also possible to use a non-transparent cover plate.

By way of example, use is made of a cover plate made of Si or made of a material having Si. Said cover plate has a thickness of approximately 1.5 mm for stability reasons and has at least partly rounded corners and edges, as a result of which it is possible to significantly reduce the risk for formation of particles and for material fracture.

The cavity plate 2 is e.g. also produced from Si or an Si-containing material and has a thickness of approximately 0.6 mm. At least outer corners and edges at the openings of the cavities may likewise advantageously be rounded as in the case of the cover plate.

Figure 6:
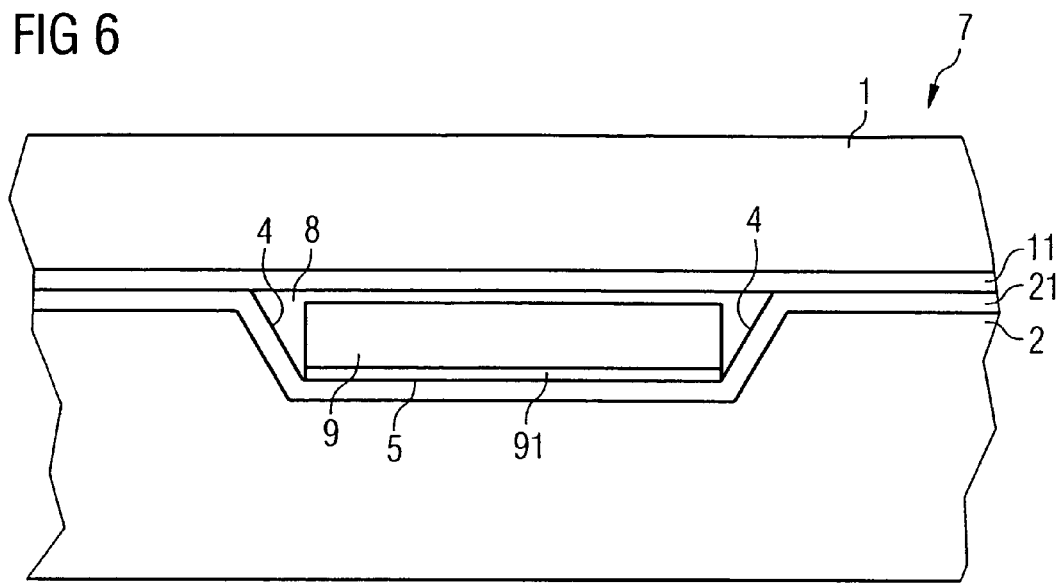
FIG. 6 shows a diagrammatic illustration of a section through a cavity plate with a cover plate in accordance with a fourth exemplary embodiment.
Figure 7:
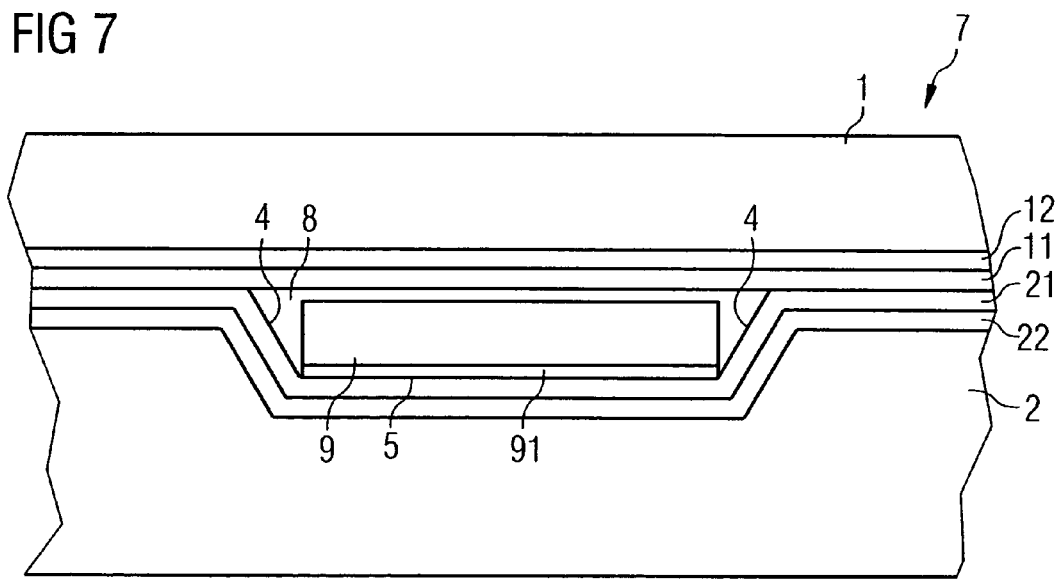
FIG. 7 shows a diagrammatic illustration of a section through a cavity plate with a cover plate in accordance with a fifth exemplary embodiment.

In order to counteract an electrostatic charging of chip receptacle and chips, the cavity plate 2 may have an electrically conductive surface layer 21 (see FIGS. 6 and 7). In addition or instead of this, the cover plate 1 may also have such an electrically conductive surface layer 11. There is a small risk of contamination through such layers when using oxidic conductive layers, such as, for example, indium tin oxide (ITO) or ZnO.

It is particularly advantageous to provide a cover plate 1 made of a radiation-transmissive material with an electrically conductive surface layer 11 made of ITO, since ITO is generally likewise radiation-transmissive. Consequently, a transparency of the cover plate 1 is not significantly reduced by the electrically conductive surface layer 11. A transparent cover plate 1 affords e.g. the possibility of checking how many and/or what type of chips 9 are situated in the cavity plate 2. It is even possible to carry out optical inspections through the transparent cover plate 1 without having to remove the cover plate 1 and exposing the chips to the risk of contamination.

The use of a transparent cover plate 1 furthermore enables simple inspection of whether the cover plate 1 actually bears in planar fashion on the cavity plate 2. If this is the case, then Newton's rings form when light is incidental between the cover plate 1 and the cavity plate 2. Conversely, an at least partial absence of such Newton's rings is an indication of the fact that the cover plate 1 does not bear in completely planar fashion on the cavity plate. This may be caused for instance by particles between the two plates or by excessively shallow cavities 8 in the cavity plate from which the chips partly protrude.

As an alternative, a suitable metallic layer may also be used as an electrically conductive surface layer 11, 21 for the cover plate 1 and/or the cavity plate 2. Such metals which are present in a contact layer 91 of the chips 9 provided are preferably selected in this case. This measure also helps to keep contamination of parts of the chips 9 as small as possible or with as little influence as possible on the chip properties, for instance by electrochemical and mechanical properties of mutually adjoining materials of the inner areas of the cavities 8 and of the chips 9 being matched to one another to the greatest possible extent.

Furthermore, in addition to the electrically conductive layer or layers, a dielectric layer 12, 22 may be arranged on the cavity plate 2 and/or the cover plate 1, as is illustrated in FIG. 7. The material of the cavity plate is advantageously passivated by the dielectric surface layers 12, 22. A suitable material for a dielectric surface layer 12, 22 is $SiO_2$, for example.

As an alternative to the exemplary embodiment illustrated in FIG. 6, the electrically conductive surface layers 11, 21 may also be replaced by dielectric surface layers 12, 22.

Figure 3:
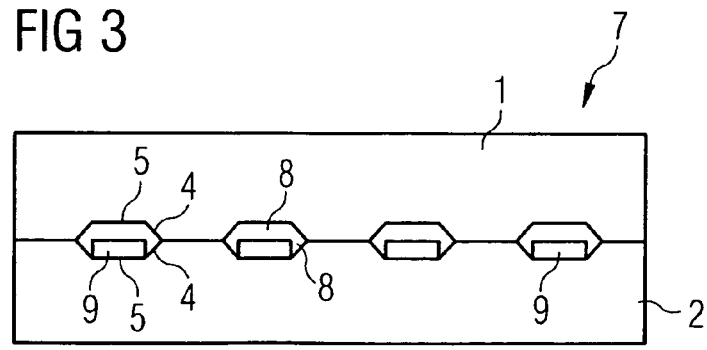
FIG. 3 shows a diagrammatic illustration of a section through a cavity plate with a cover plate in accordance with a third exemplary embodiment.

The chip receptacle in accordance with FIG. 3 differs from that mentioned above in particular by virtue of the fact that cavities 8 are also situated in the cover plate 1. In this case, a cavity 8 of the cover plate 1 is respectively assigned to a cavity 8 of the cavity plate 2, in such a way that, when the chip receptacle 7 is turned, chips 9 from the cavities 8 of the cavity plate 2 are located in the cavities 8 of the cover plate 1. By way of example, if the cover plate 1 together with the cavities 8 is formed exactly like, that is to say diametrically opposed with respect to, the cavity plate 2, the chips 9 are located in the cavities 8 in the same way as was previously the case in the cavity plate 2, with the difference that the chips are situated with the underside toward the top in the cavities 8 of the cover plate. In this position, the chips, now turned through 180°, can be removed from the cover plate 1 for example by conventional methods.

However, the cavities 8 of the cover plate 1 may also be configured differently than the cavities 8 of the cavity plate 2. By way of example, they may have a different depth or other angles of the side areas. The geometrical configurations may be adapted to the respective requirements.

In the case of the chip transport container 20 in accordance with FIG. 4, provision is made of a transport container having a bottom part 13 and a cover part 14, in each case made of plastics material. A chip receptacle 7 in accordance with FIG. 2 or FIG. 3 is arranged in a recess in the bottom part 13. A cover part 14 is connected to the bottom part 13 in such a way that the cover plate 1 is pressed onto the cavity plate 2. For this purpose, the cover part 14 has spring elements 16, for example, which press onto the cover plate 1, and may be connected to the bottom part 13 for example with the aid of screws or other releasable connecting means such as brackets or clamps.

The chip transport container 20 in accordance with FIG. 5 differs from that mentioned above in particular by virtue of the fact that the cover part 14 is formed like a bracket with bracket elements 15 which engage laterally over the bottom part 13 and engage in the latter at the bottom. As an alternative, the bracket elements 15 may engage through or in the bottom part 13 through suitable recesses therein for fixing purposes.

Such transport containers made of plastic are customary and therefore cost-effective in the semiconductor sector. By way of example, waffle packs from the company Gel-Pak® are used, in which case, in contrast to the use envisaged by said company, the rear side of the bottom part of the waffle packs is used as bearing area for the chip receptacles 7. Spring elements or clasp-like elements of the cover bracket 15 of the transport container press the cover plate 1 onto the cavity plate 2.

It is equally possible e.g. also to use waffle packs and/or plastic covers from the company Entegris® as transport containers. Both the waffle packs and the plastic covers have cut-outs which have a depth of 1.5 mm, for example, and are thus readily suitable for introducing or clamping a cavity plate 2 with a cover plate 1 therein. By way of example, the cavity plate and the cover plate may both have a thickness from the range of between 0.3 and 0.7 mm inclusive, so that they sink completely in the recess of the plastic cover or of the waffle pack. The covering plate may be removed from the recess and from the cavity plate for example by means of suction forceps.

The cavity plate is introduced e.g. into a first waffle pack with the cover plate. The first waffle pack is subsequently clamped into a second waffle pack e.g. in such a way that the cavity plate 2 and the cover plate 1 are enclosed by the waffle packs. The waffle packs may additionally also be pressed together by means of a standard plastic bracket, for example, and thus be fixed with respect to one another. Instead of two waffle packs, it is also possible to use two plastic covers or one waffle pack and one plastic cover as transport container.

As a further advantageous alternative, the cover plate 1 of the chip receptacle 7 may simultaneously be used as a cover part of the chip transport container 20 and be pressed onto the cavity plate 2 for example by means of brackets which press on the one hand onto the cover plate 1 and on the other hand onto the underside of the bottom part.

It goes without saying that the invention is not restricted to the exemplary embodiments explicitly described, but rather extends to all apparatuses and methods which have the fundamental features of the invention. In particular, the chip receptacles and chip transport containers can be used for chips having different geometries and different constructions.

With the aid of the method of anisotropic etching, it is possible to obtain cavities having different geometries which are suitable for special chip designs. Materials of the carrier plate and of the cover plate and also of the coatings can be coordinated with the chips that are to be held and transported.

The invention encompasses any new feature and also any combination of features, which, in particular, comprises any combination of features in the patent claims, even if this feature or this combination itself is not specified explicitly in the patent claims or exemplary embodiments.

What is claimed is:

1. A chip receptacle having a plurality of cavities for respectively receiving a semiconductor chip, wherein said chip receptacle comprises:
   a cavity plate, the plurality of cavities being etched in said cavity plate; and
   a cover plate having cavities each corresponding to one of the plurality of cavities in said cavity plate.

2. The chip receptacle as claimed in claim 1, wherein said cavities in said cavity plate are at least partly etched anisotropically.

3. The chip receptacle as claimed in claim 1, wherein the cavities in said cavity plate taper with increasing depth.

4. The chip receptacle as claimed in claim 3, wherein a cross section of the cavities in said cavity plate perpendicular to a surface of the cavity plate tapers trapezoidally with increasing depth.

5. The chip receptacle as claimed in claim 1, wherein the cavity plate comprises a crystalline material.

6. The chip receptacle as claimed in claim 5, wherein boundary areas of the cavities in said cavity plate lie in crystal planes of the crystalline material.

7. The chip receptacle as claimed in claim 5, wherein the cavity plate comprises a semiconductor wafer.

8. The chip receptacle as claimed in claim 7, wherein the semiconductor wafer comprises Si or GaAs.

9. The chip receptacle as claimed in claim 7, wherein the semiconductor wafer is fabricated from a crystal grown in a (100)-direction and sidewalls of the cavities in said cavity plate lie in (111)-planes.

10. The chip receptacle as claimed in claim 1, wherein the cavities in said cavity plate are at least partly etched by means of KOH.

11. The chip receptacle as claimed in claim 1, wherein the cover plate is transparent.

12. The chip receptacle as claimed in claim 1, wherein the cover plate comprises at least one material selected from the group consisting of silicon, quartz and glass.

13. The chip receptacle as claimed in claim 1, wherein the cavity plate and the cover plate have such planar contact areas that the cover plate can seal substantially tightly with the cavity plate.

14. The chip receptacle as claimed in claim 1, wherein, when the chip receptacle is turned, the semiconductor chips from the cavities of the cavity plate are received in the cavities of the cover plate.

15. The chip receptacle as claimed in claim 1, wherein a depth of the cavities in said cavity plate is greater than a height of the chips.

16. The chip receptacle as claimed in claim 15, wherein the depth of the cavities in said cavity plate is 10 µm greater than a height of the chips.

17. The chip receptacle as claimed in claim 1, wherein dimensions of a bottom area of the cavities in said cavity plate correspond to dimensions of a bottom of the chips.

18. The chip receptacle as claimed in claim 1, wherein the cavity plate has an electrically conductive surface layer.

19. The chip receptacle as claimed in claim 18, wherein the electrically conductive surface layer comprises a metal contained in a contact layer of the semiconductor chips.

20. The chip receptacle as claimed in claim 1, wherein the cover plate has an electrically conductive surface layer.

21. The chip receptacle as claimed in claim 1, wherein the cavity plate has a surface layer made of a dielectric material.

22. The chip receptacle as claimed in claim 1, wherein the cover plate has a surface layer made of a dielectric material.

23. A method for fabricating a chip receptacle having a plurality of cavities for a respective semiconductor chip, the method comprising:
   providing a cavity plate,
   etching the plurality of cavities in said cavity plate, and
   providing a cover plate,
   wherein the cover plate forms a part of the chip receptacle and has cavities corresponding to the cavities in the cavity plate.

24. The method as claimed in claim 23, wherein the etching comprises an anisotropic etching step.

25. The method as claimed in claim 23, wherein the cavities in said cavity plate are fabricated in such a way that they taper with increasing depth.

26. The method as claimed in claim 25, wherein the cavities in said cavity plate are fabricated in such a way that their cross section perpendicular to the surface of the cavity plate tapers trapezoidally with increasing depth.

27. The method as claimed in claim 23, wherein said cavity plate comprises a crystalline material.

28. The method as claimed in claim 27, wherein the cavities are fabricated such that boundary areas of the cavities in said cavity plate lie in crystal planes of the crystalline material.

29. The method as claimed in claim 27, wherein the cavity plate comprises a semiconductor wafer.

30. The method as claimed in claim 29, wherein the semiconductor wafer comprises Si or GaAs.

31. The method as claimed in one of claim 29, wherein the semiconductor wafer is fabricated from a crystal pulled in a (100)-direction and sidewalls of the cavities in the cavity plate lie in (111)-planes.

32. The method as claimed in claim 23, wherein the cover plate comprises at least one material selected from the group consisting of silicon, quartz and glass.

33. The method as claimed in claim 23, wherein the cavity plate and the cover plate have such planar contact areas that the cover plate can seal substantially tightly with the cavity plate.

34. The method as claimed in claim 23, wherein, when the chip receptacle is turned, the chips from the cavities of the cavity plate are received in the cavities of the cover plate.

35. The method as claimed in claim 23, wherein the cavities in said cavity plate are fabricated such that their depth is greater than a height of the chips.

36. The method as claimed in claim 35, wherein the cavities in said cavity plate are fabricated such that their depth is 10 µm greater than the height of the chips.

37. The method as claimed in claim 23, wherein KOH is used as an etching medium.

38. The method as claimed in claim 23, wherein dimensions of a bottom area of the cavities in said cavity plate correspond to dimensions of a bottom of the chips.

39. The method as claimed in claim 23, wherein the cavity plate is provided with an electrically conductive surface layer.

40. The method as claimed in claim 39, wherein the electrically conductive surface layer comprises a metal that is contained in a contact layer of the semiconductor chips.

41. The method as claimed in claim 23, wherein the cover plate is provided with an electrically conductive surface layer.

42. The method as claimed in claim 23, wherein the cavity plate is provided with a surface layer made of a dielectric material.

43. The method as claimed in claim 23, wherein the cover plate is provided with a surface layer made of a dielectric material.

44. A chip transport container for receiving a chip receptacle, the container comprising:
a bottom part with a recess for the chip receptacle,
a cover part with spring elements, which press the cover plate of the chip receptacle onto a cavity plate when the chip transport container is closed, and releasable connecting means for connecting the cover part and the bottom part.

45. The chip transport container as claimed in claim 44, wherein the cover part is of bracket-like design and has bracket elements which engage laterally over or laterally into the bottom part.

46. The chip transport container as claimed in claim 44, wherein the cover plate of the chip receptacle is also the cover part of the chip transport container.

47. A method for packaging a plurality of semiconductor chips, the method comprising:
providing a chip receptacle comprising a cavity plate with a plurality of cavities for respective semiconductor chips, and
placing a semiconductor chip in one of the plurality of cavities,
wherein each of the plurality of cavities tapers with increasing depth, allowing the chip to slip into the respective cavity by an intrinsic weight of the chip and without having sidewalls of the chip contacting areally with the sidewalls of the respective cavity.

48. The method as claimed in claim 47, wherein dimensions of a bottom area of the cavities in said cavity plate correspond to dimensions of a bottom of the chips.

49. The method as claimed in claim 47, wherein a bottom and sidewalls of each of the plurality of cavities form an angle of about 125.3°.

* * * * *